(12) United States Patent
Abruzzini et al.

(10) Patent No.: US 6,317,334 B1
(45) Date of Patent: Nov. 13, 2001

(54) CONFIGURATION CONNECTOR FOR MODULAR DATA STORAGE SYSTEM

(75) Inventors: Lisa Abruzzini, Mountain View; John Norman, San Jose, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/318,595

(22) Filed: May 25, 1999

(51) Int. Cl.[7] ............................... H05K 7/14; H05K 7/20

(52) U.S. Cl. .................... 361/797; 361/685; 361/730; 361/714; 361/753; 361/687; 439/928.1; 454/184

(58) Field of Search .................... 361/685, 724, 361/727, 726, 796, 797, 687, 688, 690, 715, 714, 752, 753, 730; 439/628, 638, 928.1; 454/184

(56) References Cited

U.S. PATENT DOCUMENTS

| | | | |
|---|---|---|---|
| 5,187,643 | * | 2/1993 | I-Shou ................................... 361/685 |
| 5,652,695 | * | 7/1997 | Schmitt ................................ 361/685 |

* cited by examiner

*Primary Examiner*—Jayprakash N. Gandhi
(74) *Attorney, Agent, or Firm*—David M. Mason

(57) ABSTRACT

The present invention provides a modular data storage system that allows a user to arrange various data storage module configurations within a single system enclosure. More specifically, the inventive system provides a program key and a connection extender having a configuration knob. Once the appropriate connection extender is coupled to a data storage module, the program key of the system enclosure will only accept a certain connection extender configuration into a bay slot. If data storage module connection is successful, the extender will create a thermal breezeway between the data storage drive and a receptive circuit board connector to reduce the operating temperature of the connected data storage module.

22 Claims, 9 Drawing Sheets

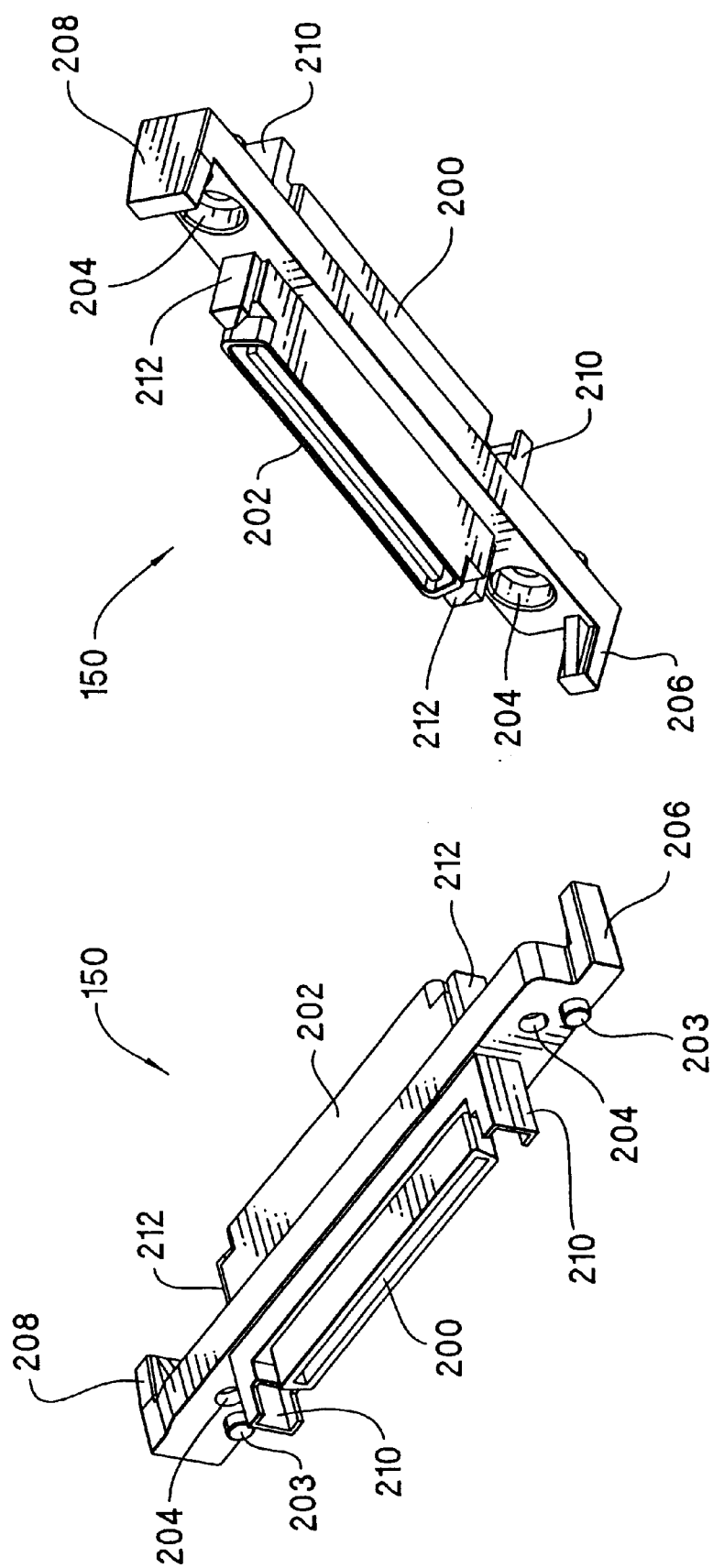

CONFIGURATION CONNECTOR FOR MODULAR DATA STORAGE SYSTEM

BACKGROUND OF THE INVENTION

1. Field of the Invention

This invention relates in general to a configuration connector for a modular data storage system, and more particularly to a connection extender and program key for regulating proper data storage drive insertion and thermal dissipation within a containing structure.

2. Description of the Related Art

In general, a common data storage system comprises multiple data storage modules that slidably dock within an enclosure. The data storage modules provide disk drives which each include a plurality of internal disks or platters that spin at high speeds within the drive during operation. Although there are numerous data storage modules and enclosures used in the industry today, few if any, can effectively accept the insertion of more than one type of data storage module within a singe enclosure and allow for enough circulation to accommodate current high speed disk drives. The disk drive size or the connector type, such as single connector attachment ("SCA") or Fibre Channel can dictate a data storage module type.

As illustrated in FIG. 1, a conventional data storage system 10 provides an enclosure 12 and multiple data storage modules 14. More specifically, enclosure 12 provides a plurality of bay slots 16 that extend linearly from the front of enclosure 12 to a backplane circuit board 18. Each bay slot 16 includes top and bottom guide tracks 20 to assist with the insertion of conventional data storage modules 14. The circuit board 18 provides a number of multiple pin connectors 22, each equally spaced from the other and aligned with a bay slot 16 and respective guide tracks 20.

Referring now to FIGS. 2A and 2B, when a data storage module 14 is to be inserted, the module is first aligned with the selected bay slot 16 by inserting the guide rails 24 of the module 14 into the guide tracks 20 of the desired bay slot 16 (see FIG. 1). Next, the data storage module 14 is slid forwardly into the module enclosure 12. As illustrated in FIG. 2A, when the data storage module 14 is nearly fully inserted into the bay slot 16, contact is made between the latch lever 26 and the lock rail 28 of the module enclosure 12. Consequently, the final step of insertion involves the user gripping the latch lever 26 and pushing it forwardly to move the data storage module 14 the remainder of the distance needed to attain complete engagement of the multiple pin connectors 22, 30. As illustrated in 6B, with the data storage module 114 completely engaged and in the locked position, there is very little space between the backplane circuit board 18 and the data storage module 14.

The above data storage system is very popular in the industry due to its simplicity in design, ease of operation, and relatively low cost to produce. However, the conventional design has problems inherent to its construction. In particular, the above conventional data storage system can only accommodate one size and type of data storage module. In addition, with the engagement of each data storage module being so close to the backplane circuit board, there is little room for the system to dissipate heat during operation from the active disk drive.

As is known in the art, the platters of the latest generation disk drives spin at speeds as high as 14K rpm creating thermal temperatures that must be regulated, otherwise, failure of the disk drives is accelerated and the probability of memory degradation or lost increases rapidly.

Considering that the rotational speed and data track density of the disc drive will continue to rapidly increase in the future and disc drive manufacturers have very limited options to cool the drive internally, it would be advantageous to develop a data storage system that could reduce the current problems exhibited by thermal heating within the associated disk drives and their related circuitry. In turn, given the higher speed disk drives are not always necessary or desirable, it would be advantageous for a data storage system to be able to accommodate all size and type of disk drives within a single data storage system.

The present invention is directed to overcoming, or at least reducing the effects of, one or more of the problems set forth above.

SUMMARY OF THE INVENTION

In one aspect of the present invention, a modular data storage system is provided including an enclosure for containing a data storage module and extender. The enclosure including a frontal opening, a compliant backplane, and a plurality of bay slots and ventilation vias. The backplane include a plurality of first electrical connectors and the bay slots extend from the frontal opening to the first electrical connectors to receive the data storage modules. At least one data storage module having a second electrical connector sized and configured to mate with one of the plurality of first electrical connectors of the backplane couples to an extender. The extender couples between the first and second electrical connectors and provides a program knob to define the data storage drive contained by the at least one data storage module;

In another aspect of the instant invention, a process is provided for securing a data storage module within a reciprocating enclosure. In particular, the process includes gripping a data storage module; aligning the data storage module with a bay slot of the enclosure; and slidably inserting the data storage module within the bay slot until an extender either receives a reciprocating electrical connector of the enclosure or contacts a program key.

BRIEF DESCRIPTION OF THE DRAWINGS

Other aspects and advantages of the invention will become apparent upon reading the following detailed description and upon reference to the drawings, in which:

FIGS. 6A and 6B illustrates an isometric view of the extender of FIG. 5; and

Figure 1:
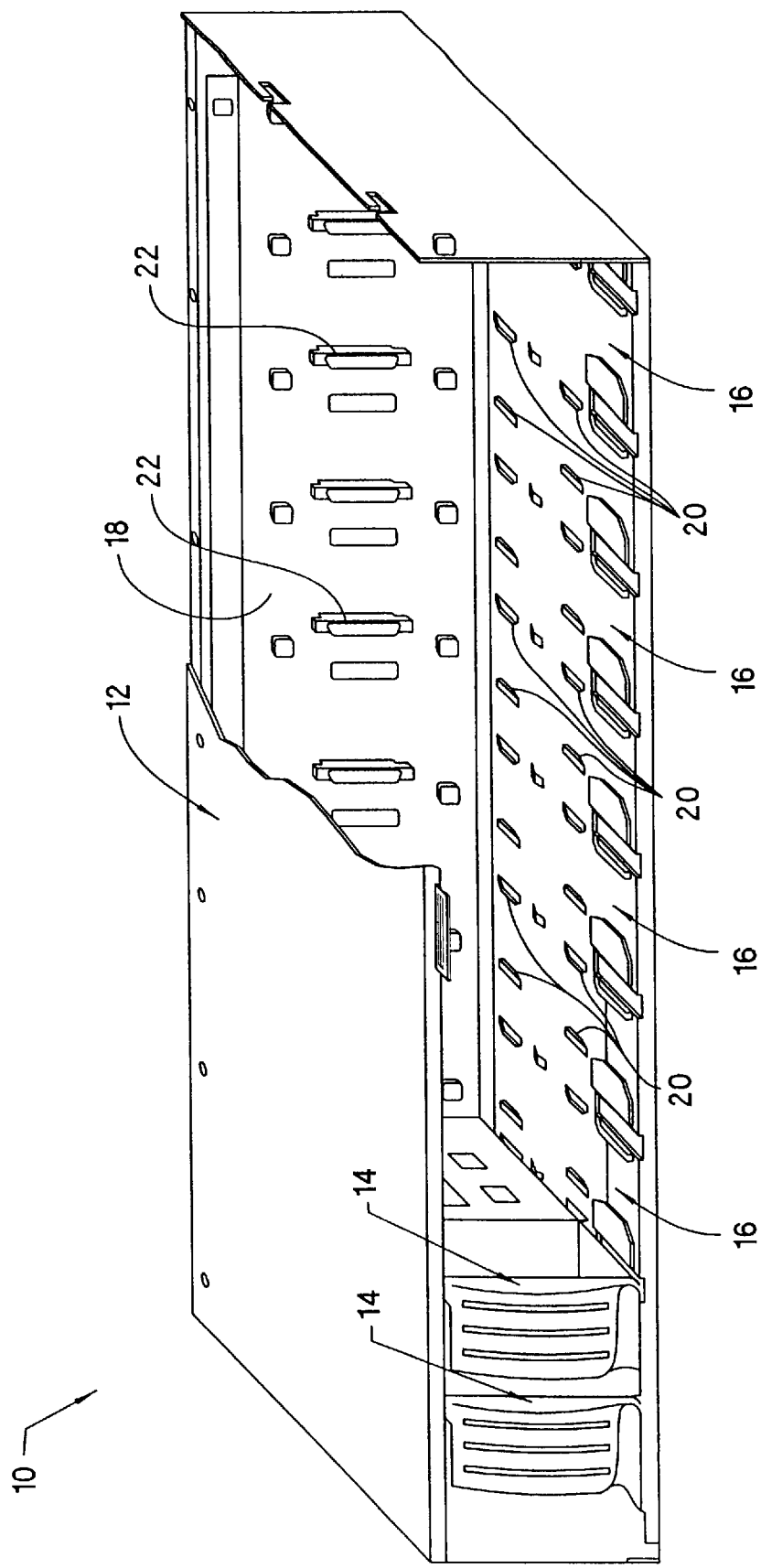
FIG. 1 illustrates a conventional data storage system.
Figure 2A:
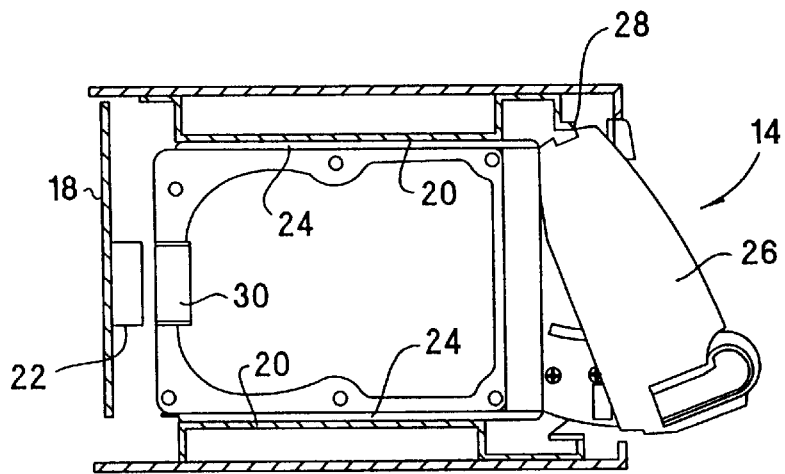
FIGS. 2A and 2B illustrate a conventional process of inserting a data storage module within the system of FIG. 1.
Figure 2B:
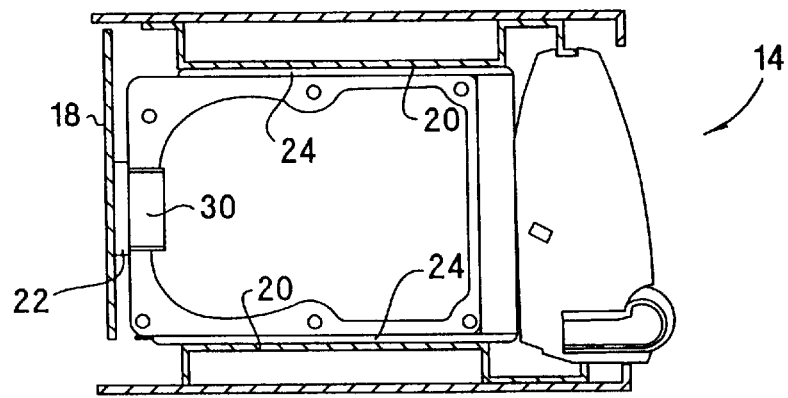

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides a compact, efficient, and effective means for allowing a user to configure a data storage system to contain or interchange more than one type or size of data storage module. In addition, the inventive system provides means to reduce excessive or undesirable thermal heating within the system during operation and prevent data storage modules from being position in bay slots that are not compatible. Consequently, the present invention is directed to substantially reduce the risk of current high speed disk drives from over heating during operation and provide a means for a data storage system to accept any type of data storage module. The data storage module type may vary in disk drive speed, size or the type of connector used.

Figure 3:
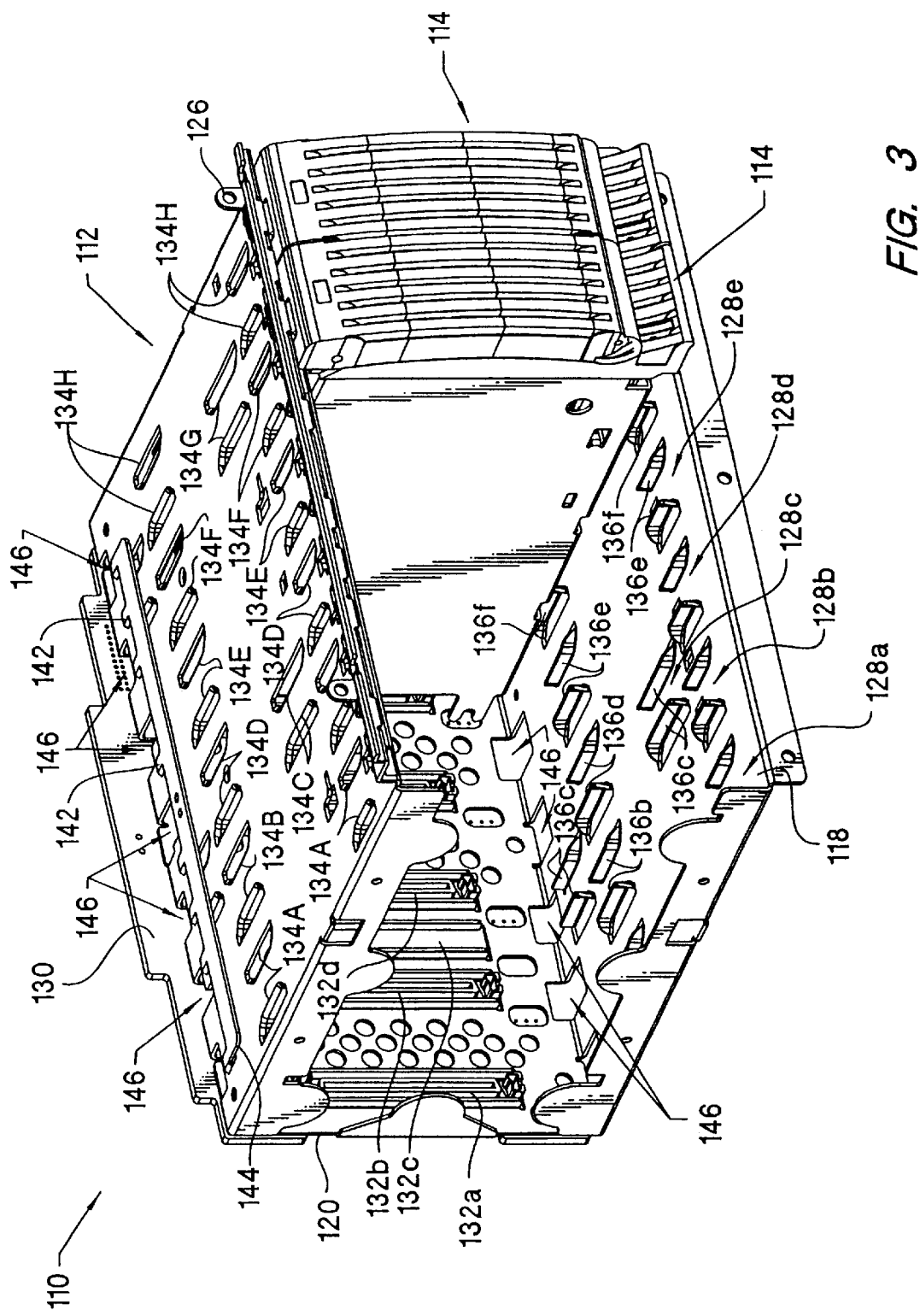
FIG. 3 illustrates a data storage system in accordance with one embodiment of the present invention.
Figure 4:
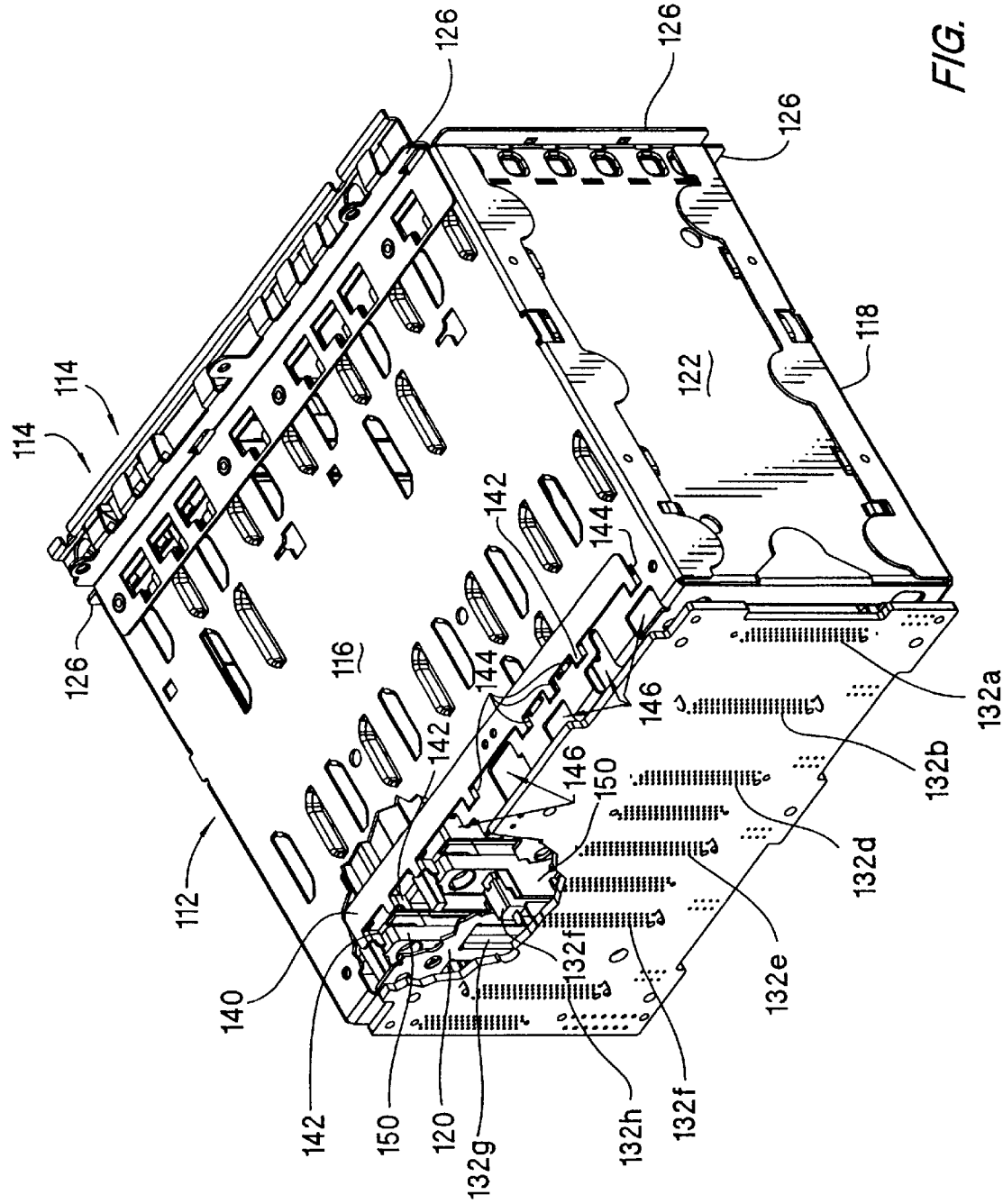
FIG. 4 illustrates a back side isometric view having a cut-away of the data storage system of FIG. 3.

Referring now to the drawings, FIG. 3 illustrates an isometric view of a data storage system 110 having a plurality of data storage modules 114 slidably inserted within an enclosure 112. A side wall has been removed to view the interior of enclosure 112. FIG. 4 illustrates a back side isometric view of the same data storage system 110 of FIG. 3. However, in this view the side wall is inserted and a cut-away shows how the data storage module 114 (see FIG. 3) attaches to the enclosure 112. Generally, enclosure 112 forms part of an equipment component (not shown). An equipment component could include a personal computer, a network server, or simply a system comprising a redundant array of inexpensive drives ("RAID").

Enclosure 112 comprises a substantially rectilinear housing that includes a top side 116, a bottom side 118, a backplane 120, and a pair of oppositely opposed lateral walls 122 to form an open-faced configuration. In this embodiment, a single piece of cold rolled steel is molded to form top side 116, bottom side 118, and back plane 120, and two separate pieces of the same material are used to form walls 122. Using conventional methods, such as welding, rivets, adhesives and/or a complimentary slot and tab fitting, a rigid structure can be constructed as illustrated. To assist with the process of securing enclosure 112 within a desired equipment component, mounting flanges 126 are formed on the front edge of the top side 116, bottom side 118 and lateral walls 122.

As illustrated in FIG. 3, the inside of enclosure 112 provides a plurality of bay slots 128a–h. Each bay slot extends from the front of enclosure 112 to a main circuit board 130. Circuit board 130 provides a plurality of multi-pin connectors 132a–h (see FIG. 3) that compliment bay slots 128a–h.

Each bay slot can be further defined by a top and bottom set of guide tracks 134a–h and 136a–h, respectively, that are integrally formed within enclosure 112 and aid the user in aligning and securing data storage modules 114 in their respective bay slots 128a–h. In a preferred embodiment, circuit board connector slots 132c and 132g provide a lateral space between adjacent connectors that is smaller than the lateral space between the other circuit board connectors 132a–b, 132d–f and 132h. This inequality of spacing between circuit board connectors allows and slots the user to insert different types of data storage modules 114 within enclosure 112 without having to exchange circuit board 130. Circuit board 130 may be positioned on either surface of backplane 120 and attached by conventional means such as fasteners, adhesive and clamps.

Adjacent back plane 120, a program key 140 is attached to top side 116 of enclosure 112 using a conventional method. As illustrated in FIGS. 3 and 4, program key 140 provides tabs 142 that extend through vias 144 of enclosure 112. The portion of tabs 142 that extend into the volume of enclosure 112 define the type of drives, or what combination of drive types can be contained by data storage module 114 within module enclosure 112. In particular, the placement of tabs 142 can prevent any undesirable data storage module 114 from contacting a multi-pin connector 132a–h of circuit board 130 by interacting with extension connector 150 (see FIG. 4). Program key 140 is preferably made from a spring material such as stainless steel. Extension connector 150 is preferably made from a material such a polymeric resin. As is apparent from FIG. 3, when data storage modules 114 are inserted within the enclosure 112, data storage modules 114 are tightly packed with respect to each other such that the system provides for a very high mass storage density. However, as discussed with regard to the prior art, a tightly packed configuration between the data storage module and the circuit board is not necessarily desirable because the thermal heat dissipated by an operational disk drive may create problems within the data storage system. Consequently, the present invention has attached an extension connector 150 to data storage module 114, and provided air holes 146 within the top and bottom sides 116, 118 to create a circulation area or breezeway through enclosure 112 as illustrated in FIG. 4.

Air holes 146 are strategically positioned to allow the optimum amount of air pass through enclosure 112, and thereby reduce thermal heating of each data storage module 114 during operation. In fact, as will be described in more detail below, tests have shown that by using extension connectors 150 and air holes 146, thermal heating of a conventional data storage system can decrease by about 10° F.

Figure 5:
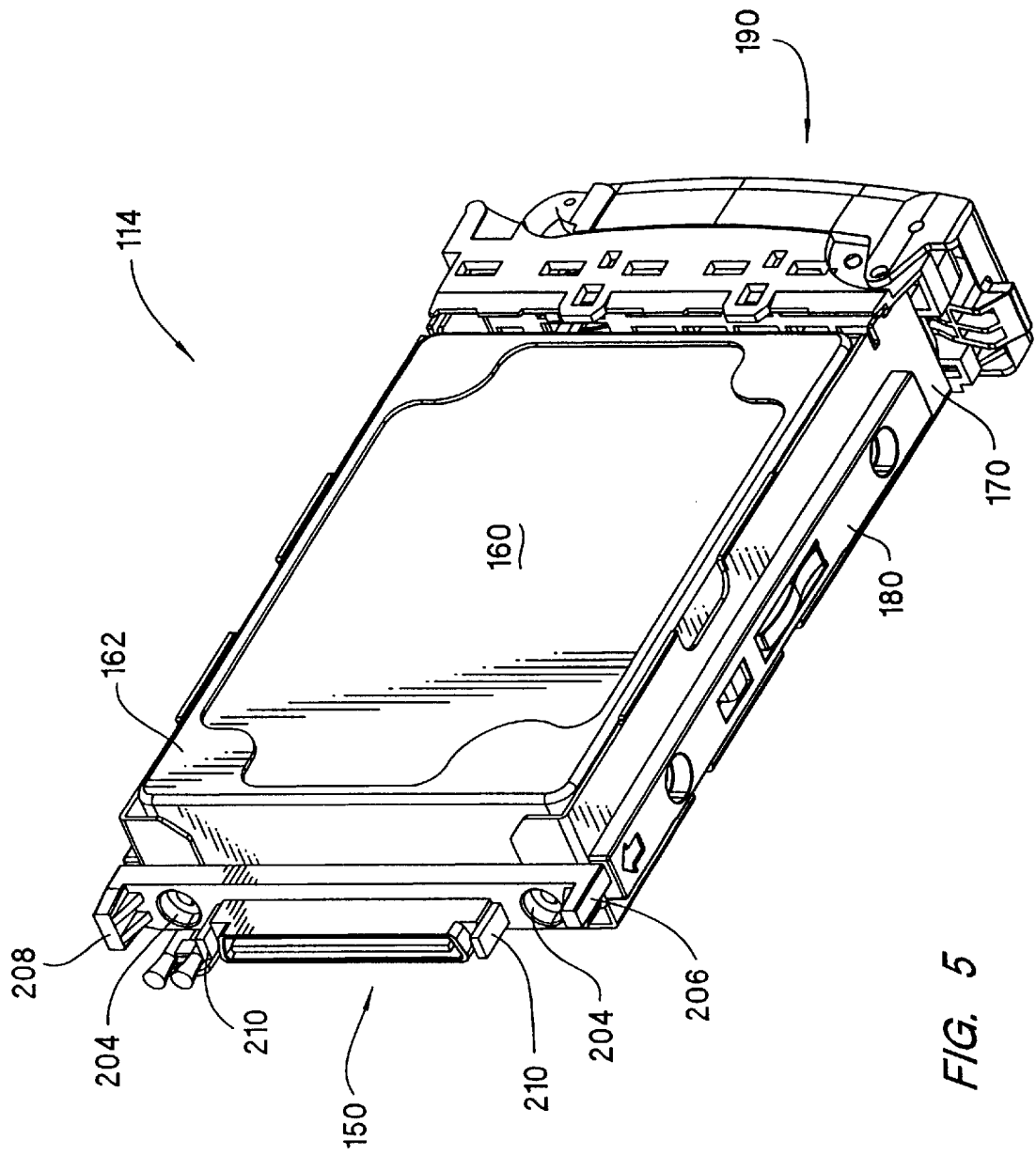
FIG. 5 illustrates an isometric view of the data storage module of FIG. 3.

Turning now to FIG. 5, a data storage module 114 of FIGS. 3–4 has been removed from enclosure 112 to illustrate its structural features. In general, data storage module 114 is constructed to include an extension connector 150, a conventional data storage device 160, a device tray 170, guide rails 180, and a locking mechanism 190.

More specifically, extension connector 150, data storage drive 160, guide rails 180 and locking mechanism 190 secure to drive tray 170 using a conventional method, such as screws, adhesive, rivets, etc.. Guide rails 180 are adapted to be received by any one of bay slots 128a–h between respective guide tracks 134a–h and 136a–h of enclosure 112 (see FIGS. 3–4). More specifically once guide rails 180 are aligned with the desired set of guide tracks, guide rails 180 facilitate insertion of the data storage modules 114 into enclosure 112. Typically, drive tray 170 is constructed of a rigid material such as cold rolled steel, guide rails 180 are constructed of a relatively soft material such as a polymeric resin material, and locking mechanism 190 is formed of a poly-resin material, such as plastic.

Conventional disk drive 160 generally includes a sealed housing 162 containing a head/disk assembly comprising one or more disks or platters, which rotate at constant speeds during operation (not shown). Integrated with sealed housing 162 is a conventional disk drive circuit board coupled to a multiple pin connector (neither shown) that can mate with connector 132 of circuit board 130 or connection extender 150 (see FIGS. 3 and 4).

As is known in the art, disk drives are high precision instruments that are designed to provide trouble free operation in a controlled environment. Consequently, as discussed above, data storage modules 114 containing disk drives 160 must be maintained within a temperature specific environment, otherwise they may sustain damages or degradation of the data storage performance due to over heating.

Referring to FIGS. 6A and 6B, it can be illustrated that extension connector 150 (hereinafter "extenuator") provides two multi-pin connectors, male connector 200 and female connector 202. As illustrated in FIG. 5, when extenuator 150 connects to disk drive 160, male connector 200 is received by a complimentary female connector (not shown) of disk drive 160. To secure their union, mounting cylinders 203 align with extenuator mounting holes (not shown) of drive tray 170 and a securing element, such as a screw, is positioned through mounting holes 204 of extenuator 150 and securely attached to drive tray 170.

A program knob 206 and stop knob 208 are positioned at distal ends of extenuator 150 and provide tapered ends to help with the alignment and insertion of a data storage module 114. Program knob 206 also interacts with program key 140 (see FIG. 4) of enclosure 112 to prevent the insertion of any data storage module that does not provide the proper connector or disk drive. Adjacent to male and female connectors 200 and 202, extenuator 150 provides ground fingers 210 and 212, respectively, to protect signals between connectors against electrostatic discharge ("EDS") and allow for blind mating of complimentary connectors. Consequently, extenuator 150 establishes the necessary program knob 208 to identify the type of data storage module. In addition, the size of extenuator 150 creates a good ventilation space between an enclosure circuit board and a data storage module to reduce thermal heating of a data storage module during operation.

In a preferred embodiment, male and female connectors 200 and 202 of extenuator 150 will provide a single connector attachment ("SCA-2") configuration having 40 or 80 pins. Typically, within each connector, two different lead lengths provide sequential mating for various functions such as signal, power, last mate and first break. This sequential mating ability simplifies hot swapping, such that there is no need to power down the host data storage system to remove a drive from a disk array. In turn, this connector configuration will accommodate all SCSI-3 data signals and control, auxiliary and power signals.

Persons of ordinary skill in the relevant arts should appreciate that other connector configurations could be used for extenuator 150. For example, a "Fibre Channel" connector could be used with the disk drive of data storage module 114. However, the new connector type will dictate that both male and female connectors 150 and circuit board connectors 132 provide a complimentary pin layout and geometry. If desired, both SCA-2 and Fibre Channel disk drives can be incorporated within the same data storage system provided that the associated circuit board 130 also provides both connector types.

Figure 7A:
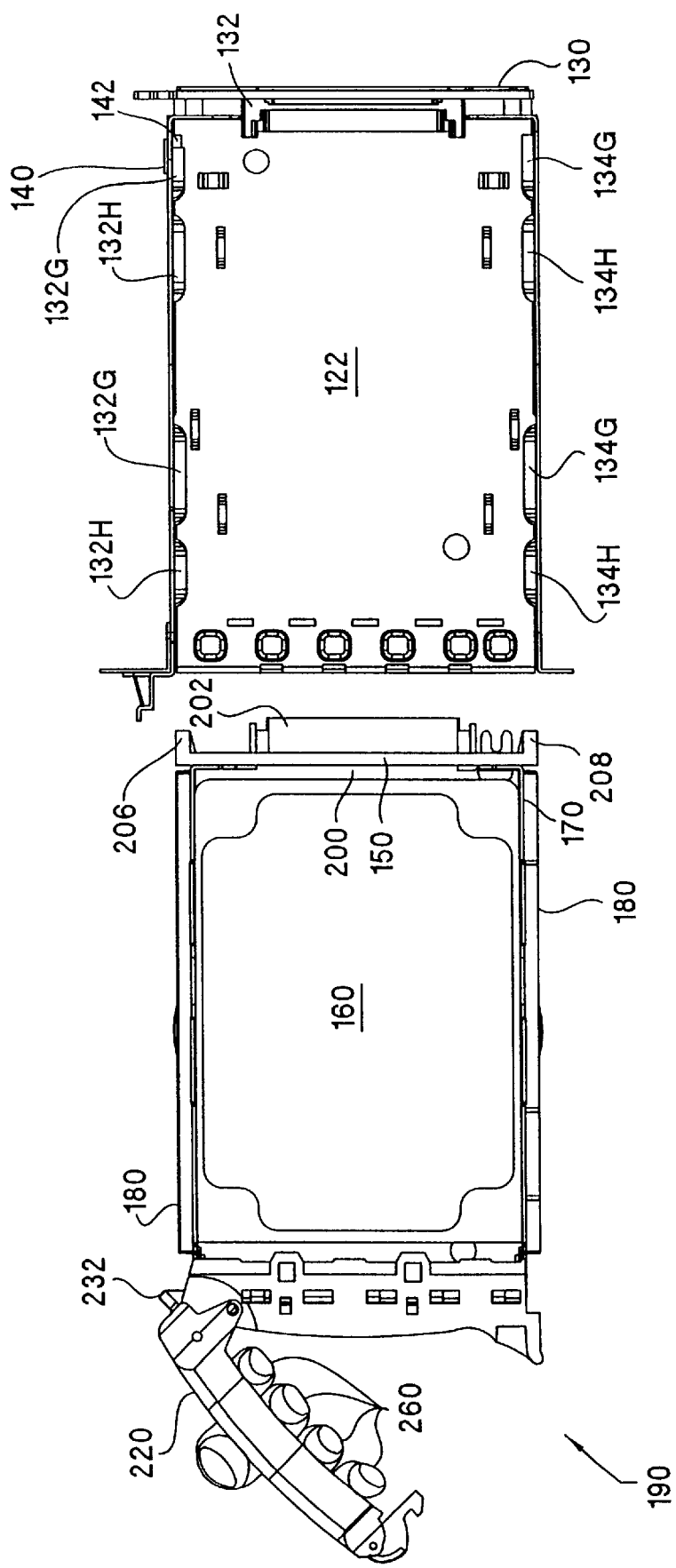
FIGS. 7A–7C illustrate a process for inserting the data storage module of FIG. 3 within an enclosure using the program key and extender of FIGS. 4 and 6A and 6B.

Now that the primary structural features of the invention have been described, the process for inserting a data storage module 114 having an extenuator 150, and how it interacts with program key 140 will follow. For this example, reference will be made to FIGS. 7A–7C. These Figs illustrate a side view of FIGS. 3 and 4 having the side wall 122 adjacent data storage module 114 removed. Consequently, the following example will be described for only bay slot 128h. However, a skilled artisan should appreciate that the same method used to insert data storage module 114 within bay slot 128h can also be used for all other bay slots 128a–128g of enclosure 112 (see FIGS. 3 and 4).

To insert data storage module 114 within enclosure 114, the user first aligns guide rails 180 between the top and bottom front guide tracks 134h and 136h. Next, the tapered portion of program knob 206 and stop knob 208 is inserted between front guide tracks 134h and 136h and slid forwardly into enclosure 112. With continued pressure, guide rails 180 pass smoothly along top and bottom front guide tracks 134h and eventually engage the top and bottom back guide tracks 134h and 136h.

At this stage of the insertion, tabs 142 of program key 140 will either prevent or allow program knob 206 to pass. As mentioned earlier, if circuit board connector 132h provides a SCA-2 type connector and disk drive 160 provides a Fibre channel type connector, program knob 206 would not allow data storage module 114 from proceeding any further within slot 128h. This is possible because program key vias 144 of enclosure 112 are positioned to allow only a specific configuration according to the layout of connectors 132a–h on circuit board 130. Consequently, a skilled artisan should appreciate that other program key vias adjacent to vias 144 could be established within enclosure 112 to allow for program key 140 to dictate an alternative data storage module configuration or layout that would accommodate connectors 132a–h of circuit board 130.

However, with this example, both connector 132h and 202 provide the same connector type, therefore, data storage module 114 passes by program key tab 142 and engages connector 132h of circuit board 130. (see also FIG. 4).

Figure 7B:
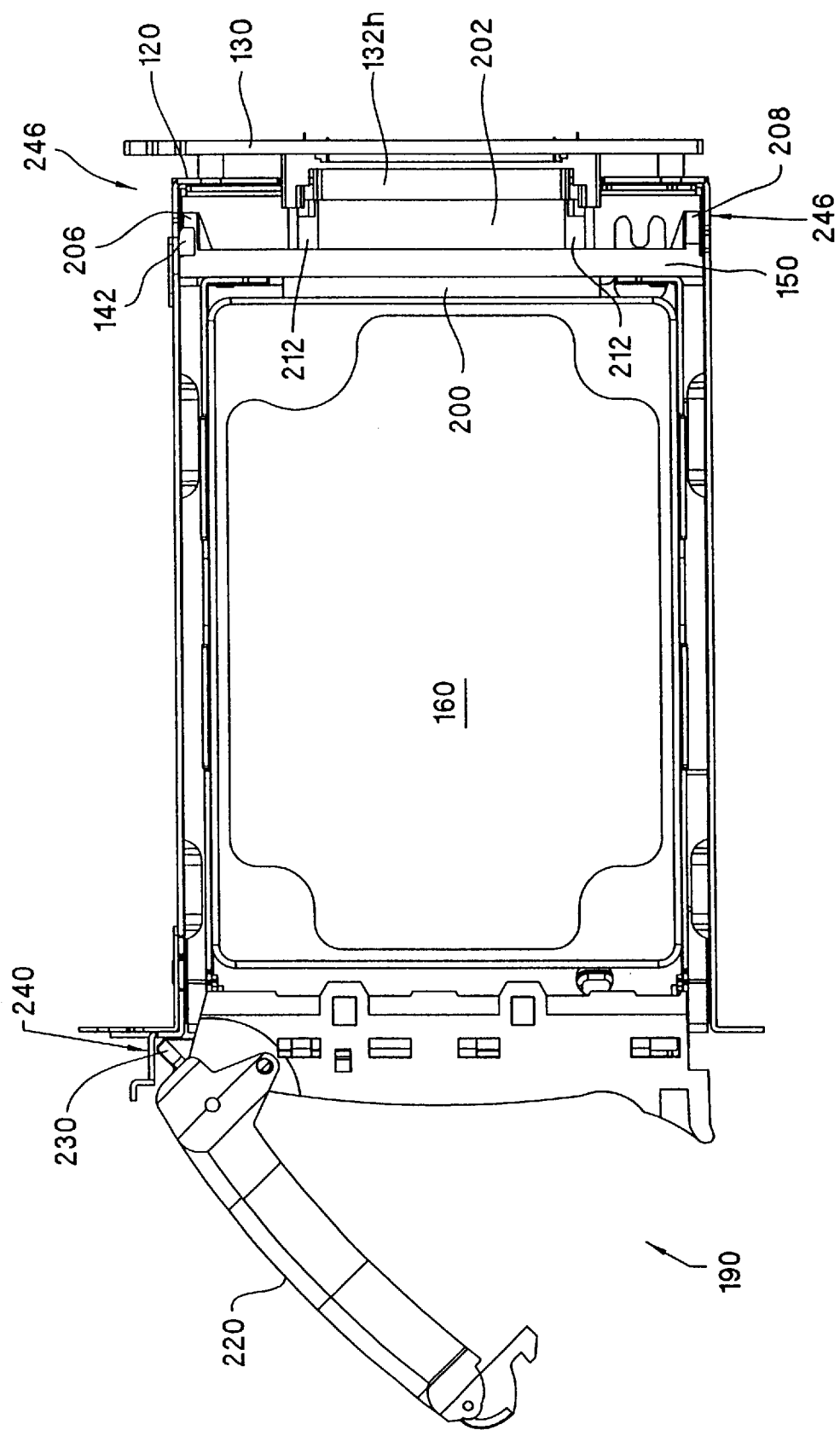
Figure 7C:
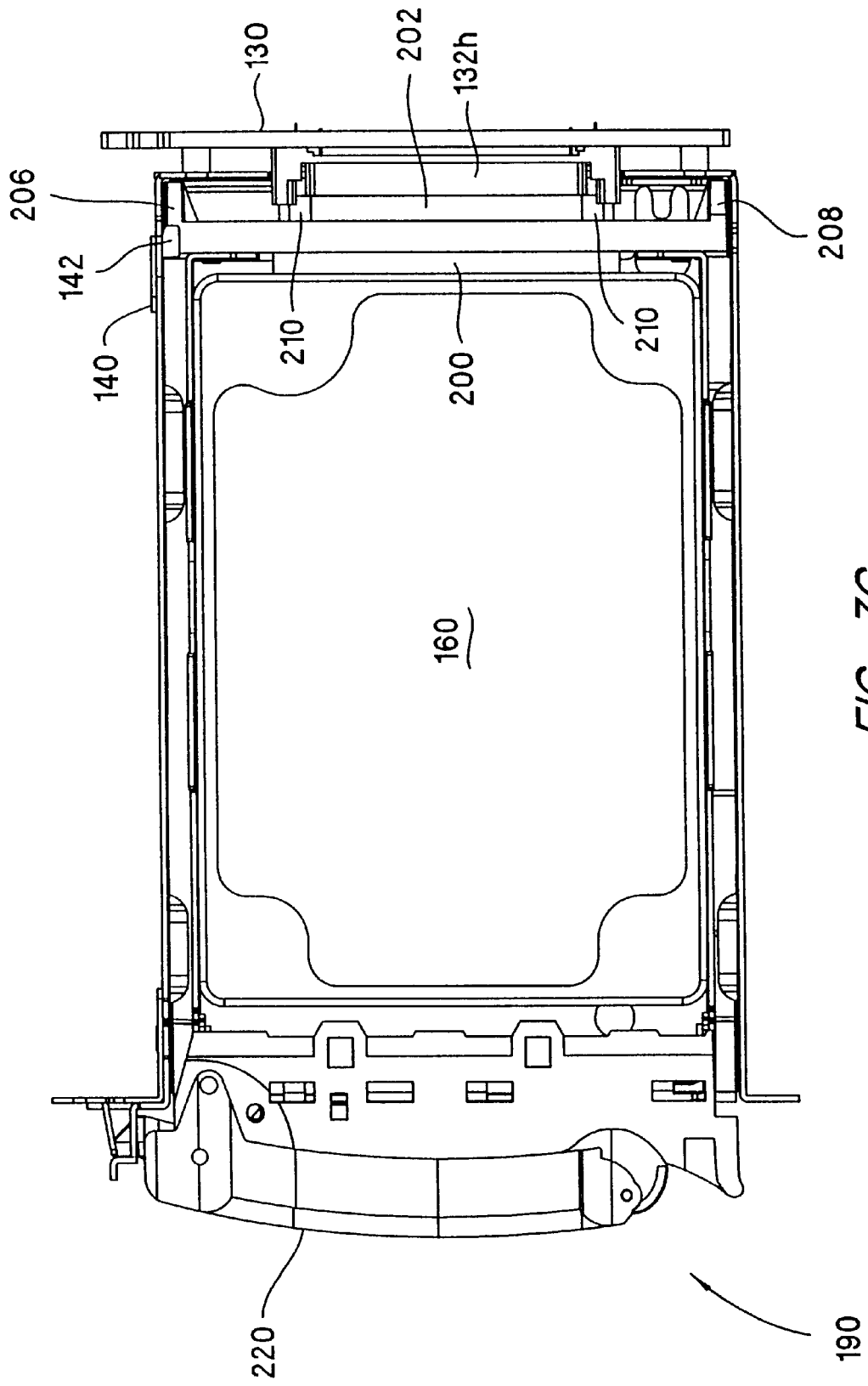

With data storage module 114 nearly inserted into bay slot 128h, as illustrated in FIG. 7B, female connector 202 and finger grounds 212 align with circuit board connector 132h. Consequently, the final stage of the insertion process involves the user applying a forward pressure from their fingers 260 to rotate lever 220 in a downward or compressing direction such that lock knob 230 contacts and fills lock via 240. This motion allows data storage module 114 to move forward the remainder of the distance needed to attain complete engagement of connectors 132, 202 as illustrated in FIG. 7C.

The smooth motion used to insert data storage module 114 is transparent with the process for removing the same. In particular, the user can remove data storage module 114 by first extending lever 220 to a position as illustrated in FIG. 7B and than applying a small pulling motion to extract data storage module 114 from bay slot 128h.

The above process allows a data storage module 114 to be quickly and easily electrically connected to circuit board 130 of the module enclosure 112. In turn, the process for doing the same requires a relatively small continuous force to provide a smooth locking and unlocking motion so that no jolting motions or excessive pressure has to be used that might otherwise destroy or damage the disk drive memory or circuit board. Once locked, data storage module 114 is held tightly in place to provide a hard mount within module enclosure 112. This hard mounting greatly attenuates the rotational vibrations created by the spinning platters and eliminates contact between the individual platters of a disk drive. In addition, extenuator 150 provides enough space between the circuit board and a coupled data storage module that other circuit board connectors can be contained or hidden behind a coupled data storage module when not in use. Therefore, the present system, with the use of extenuator 150 can provide a circuit board that may have more connectors than it can use at any given time. In turn these same connectors may provide the same or various types of configurations, and any one of them may be unused and hidden behind any number of data storage modules used to fill an enclosure. As illustrated from the above example, extenuator 150 also allows a data storage module 114 to be locked within a enclosure 112 such that a ventilation area 250 is created between backplane 120, data storage module 114, and air holes 246.

In summary, the present inventive data storage system provides an extension connector and program key to effectively allow a user to develop a data storage system having different size/type data storage modules within a respective enclosure. In addition, the present invention provides a reliable, cost efficient, and effective way to reduce the thermal heat created by an operational disk drive of the data storage module system without compromising the ease of operation, data storage density, manufacturing cost, and manufacturability of its parts.

What is claimed is:

1. A data storage module and enclosure apparatus, comprising:

the enclosure including a frontal opening, a compliant back plate, bay slots and ventilation vias, the backplane includes first electrical connectors, and the bay slots extend from the frontal opening to the first electrical connectors to receive the data storage module;

a program key attached adjacent to the backplane and above the bay slots and ventilation vias;

the data storage module having a second electrical connector sized and configured to mate with one of the first electrical connectors; and an extender coupled between one of the first electrical connectors and the second electrical connector, the extender provides a program knob to define the data storage drive contained by the data storage module.

2. The apparatus of claim 1, wherein the program key defines the size and type of data storage module that can be received by the first electrical connectors.

3. The apparatus of claim 1, wherein the extender laterally spaces the second electrical connector of the data storage module from the first electrical connectors to provide a thermal breezeway.

4. The apparatus of claim 1, wherein the first electrical connectors accommodate different data storage module configurations to be inserted into the enclosure.

5. The apparatus of claim 1, wherein the extender couples to the data storage module by a securing element selected from the group including screws, adhesive, rivets and welds.

6. The apparatus of claim 1 wherein the extender further includes grounding fingers that protect signals traveling through the extender and coupled first and second electrical connectors from electrostatic discharge.

7. The apparatus of claim 1, wherein the extender further includes grounding fingers for blind mating the extender being coupled between the first and second electrical connectors.

8. A data storage module and enclosure system, comprising:

the enclosure including a frontal opening, a compliant backplane, bay slots and ventilation vias, the backplane provides first electrical connectors, and the bay slots extend from the frontal opening to the first electrical connectors to receive the data storage module;

the data storage module having a second electrical connector sized and configured to mate with one of the first electrical connectors of the backplane; and an extender to provide a thermal breezeway within the enclosure and adjacent the backplane when being coupled between the second electrical connector and one of the first electrical connectors, the extender includes a program knob to define the data storage drive contained by the data storage module.

9. The apparatus of claim 8, further including a program key attached adjacent to the backplane and above the bay slots and ventilation vias to interact with the program knob if an unacceptable data storage drive is inserted into one of the bay slots of the enclosure.

10. The apparatus of claim 8, wherein the extender further includes grounding fingers for blind mating the extender with one of the first electrical connectors and the reduction of electrostatic discharge between the first and second electrical connectors.

11. The apparatus of claim 8, wherein the extender further includes grounding fingers for reducing electrostatic discharge between coupled first and second electrical connectors.

12. The apparatus of claim 8, wherein the extender further includes a stop knob to prevent over insertion of the extender between the second electrical connector and one of the first electrical connectors.

13. The apparatus of claim 8, wherein the first electrical connectors accommodate different data storage module configurations to be insert into the enclosure.

14. A data storage module and enclosure system, comprising:

the enclosure including a frontal opening, a compliant backplane, bay slots and ventilation vias, the backplane provides first electrical connectors and the bay slots extend from the frontal opening to the first electrical connectors to receive the data storage module;

the data storage module having a second electrical connector sized and configured to mate with one of the first electrical connectors of the backplane;

an extender to provide a thermal breezeway within the enclosure and adjacent the backplane when being coupled between the second electrical connector and one of the first electrical connectors; and a program key attached adjacent to the backplane and above the bay slots and ventilation vias to interact with the program knob if an unacceptable data storage drive is inserted into one of the bay slots of the enclosure.

15. A data storage module and enclosure system, comprising:

the enclosure including a frontal opening, a compliant backplane, bay slots and ventilation vias, the backplane provides first electrical connectors and the bay slots extend from the frontal opening to the first electrical connectors to receive the data storage module;

the data storage module having a second electrical connector sized and configured to mate with one of the first electrical connectors of the backplane; and an extender to provide a thermal breezeway within the enclosure and adjacent the backplane when being coupled between the second electrical connector and one of the first electrical connectors, the extender includes grounding fingers for blind mating the extender with one of the first electrical connectors and the reduction of electrostatic discharge between the first and second electrical connectors.

16. A data storage module and enclosure system, comprising:

the enclosure including a frontal opening, a compliant backplane, bay slots and ventilation vias, the backplane provides first electrical connectors and the bay slots extend from the frontal opening to the first electrical connectors to receive the data storage module;

the data storage module having a second electrical connector sized and configured to mate with one of the first electrical connectors of the backplane; and an extender to provide a thermal breezeway within the enclosure and adjacent the backplane when being coupled between the second electrical connector and one of the first electrical connectors, the extender includes grounding fingers for reducing electrostatic discharge between coupled first and second electrical connectors.

17. A data storage module and enclosure system, comprising:

the enclosure including a frontal opening, a compliant backplane, bay slots and ventilation vias, the backplane provides first electrical connectors and the bay slots extend from the frontal opening to the first electrical connectors to receive the data storage module;

the data storage module having a second electrical connector sized and configured to mate with one of the first electrical connectors of the backplane; and an extender to provide a thermal breezeway within the enclosure and adjacent the backplane when being coupled between the second electrical connector and one of the first electrical connectors, the extender includes a stop knob to prevent over insertion of the extender between the second electrical connector and one of the first electrical connectors.

18. A process for securing a data storage module within a reciprocating enclosure, comprising:

gripping a data storage module;

aligning the data storage module with a bay slot within the enclosure; and slidably inserting the data storage module within the bay slot until an extender either receives a reciprocating electrical connector of the enclosure or contacts a program key, the extender includes a stop knob to prevent the over insertion of the extender being coupled between the first and second electrical connectors.

19. The process of claim 18, wherein the step of slidably inserting the data module further includes creating a thermal breezeway within the enclosure.

20. The process of claim 18, wherein the step of slidably inserting further includes the inserted data module covering an adjacent electrical connector.

21. A process for securing a data storage module within a reciprocating enclosure, comprising:

gripping a data storage module;

aligning the data storage module with a bay slot within the enclosure; and slidably inserting the data storage module within the bay slot until an extender either receives a reciprocating electrical connector of the enclosure or contacts a program key, the extender includes grounding fingers that protect signals traveling through the extender and coupled first and second electrical connectors from electrostatic discharge.

22. A process for securing a data storage module within a reciprocating enclosure, comprising:

gripping a data storage module;

aligning the data storage module with a bay slot within the enclosure; and slidably inserting the data storage module within the bay slot until an extender either receives a reciprocating electrical connector of the enclosure or contacts a program key, the extender includes grounding fingers for blind mating the extender being coupled between the first and second electrical connectors.

* * * * *